(12) United States Patent
Kundu et al.

(10) Patent No.: US 12,381,558 B2
(45) Date of Patent: Aug. 5, 2025

(54) LEVEL SHIFTER FOR HIGH VOLTAGE DRIVER

(71) Applicant: Texas Instruments Incorporated, Dallas, TX (US)

(72) Inventors: Amal Kumar Kundu, Bangalore (IN); Anant Shankar Kamath, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 48 days.

(21) Appl. No.: 18/391,909

(22) Filed: Dec. 21, 2023

(65) Prior Publication Data

US 2025/0158614 A1    May 15, 2025

(30) Foreign Application Priority Data

Nov. 9, 2023    (IN) .............................. 202341076596

(51) Int. Cl.
| | | |
|---|---|---|
| *H03K 19/0185* | (2006.01) | |
| *H02M 1/08* | (2006.01) | |
| *H02M 1/32* | (2007.01) | |
| *H03K 17/082* | (2006.01) | |

(52) U.S. Cl.
CPC ...... *H03K 19/018507* (2013.01); *H02M 1/08* (2013.01); *H02M 1/32* (2013.01); *H03K 17/0822* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | |
|---|---|---|
| 7,199,617 B1 | 4/2007 | Schrom et al. |
| 9,843,311 B2 | 12/2017 | Green et al. |
| 9,929,652 B1 | 3/2018 | Ribarich et al. |
| 10,193,554 B1 | 1/2019 | Sharma et al. |
| 10,305,472 B1 | 5/2019 | Kinzer et al. |
| 10,348,293 B2 * | 7/2019 | Abesingha .............. H02M 1/08 |
| 10,482,952 B2 | 11/2019 | Campbell et al. |
| 10,734,982 B2 | 8/2020 | Abesingha et al. |
| 10,771,045 B1 | 9/2020 | Chen |
| 11,165,426 B1 | 11/2021 | Ashourloo et al. |
| 11,605,955 B2 | 3/2023 | Kinzer et al. |

(Continued)

*Primary Examiner* — Jeffrey S Zweizig
(74) *Attorney, Agent, or Firm* — Charles F. Koch; Frank D. Cimino

(57) ABSTRACT

Described embodiments include a voltage level shifter with a first driver having an input that receives a first signal, an output, a positive supply terminal coupled to a first supply terminal, and a negative supply terminal coupled to a second supply terminal. A transistor has first and second current terminals and a first control terminal. The first current terminal is coupled to the first driver output, and the first control terminal is adapted to be coupled to a low-side drive transistor control terminal. A second driver has an input coupled to the second current terminal, an output, a positive supply terminal coupled to a third supply terminal, and a negative supply terminal coupled to ground. The second driver provides a second signal at the second driver output. A voltage at the third supply terminal is less than 10% of a voltage at the first supply terminal.

21 Claims, 7 Drawing Sheets

(56) References Cited

U.S. PATENT DOCUMENTS

| | | | |
|---|---|---|---|
| 11,646,737 B1 * | 5/2023 | Chan ................ | H03K 19/00361 |
| | | | 327/333 |
| 11,658,654 B2 | 5/2023 | Wu | |
| 2006/0087470 A1 | 4/2006 | Abdoulin | |
| 2021/0184562 A1 | 6/2021 | Akahane | |

* cited by examiner

LEVEL SHIFTER FOR HIGH VOLTAGE DRIVER

CROSS-REFERENCE TO RELATED APPLICATION

This application claims priority to India patent application No. 202341076596 filed Nov. 9, 2023, which is incorporated herein by reference in its entirety.

BACKGROUND

This description relates to signal level shifters such as the circuits that translate a signal from a first voltage domain to a second voltage domain. The first voltage domain could be a higher voltage domain, and the second voltage domain could be a lower voltage domain. Conversely, the first voltage domain could be a lower voltage domain, and the second voltage domain could be a higher voltage domain.

Many power modules have a requirement for bidirectional signal transfer between a high voltage domain and a low voltage domain. The signals being transferred between voltage domains could be, for example, signals for voltage regulation or protection features, such as an overvoltage indicator, overcurrent indicator, or overtemperature indicator. Typically, monolithic half-bridge power drive stages include a monolithic down level shifter to transfer logic signals from the higher voltage domain to the lower voltage domain because the controller is powered by the low voltage supply.

In many cases, traditional monolithic down level shifters use a drain extended p-channel metal oxide semiconductor (DEPMOS) transistor. However, DEPMOS semiconductor processes typically do not support higher voltages (e.g. >120V). So, monolithic bidirectional level shifters for higher voltage signals may require a multi-die multichip module (MCM) solution to meet the voltage specification, thus increasing its cost significantly.

SUMMARY

In a first example, a circuit for voltage level shifting includes a first driver having a first driver input, a first driver output, a first driver positive supply terminal, and a first driver negative supply terminal. The first driver input is configured to receive a first signal. The first driver positive supply terminal is coupled to a first voltage supply terminal, and the first driver negative supply terminal is coupled to a second voltage supply terminal.

A transistor has first and second current terminals and a first control terminal. The first current terminal is coupled to the first driver output, and the first control terminal is adapted to be coupled to a low-side drive transistor control terminal. A second driver has a second driver input, a second driver output, a second driver positive supply terminal, and a second driver negative supply terminal. The second driver input is coupled to the second current terminal. The second driver positive supply terminal is coupled to a third voltage supply terminal, and the second driver negative supply terminal is coupled to a ground terminal.

The second driver is configured to provide a second signal at the second driver output. A voltage at the third voltage supply terminal is less than 10% of a voltage at the first voltage supply terminal. A resistor is coupled between the third voltage supply terminal and the second driver input.

In a second example, a level shifting circuit includes a diode module having a diode module input, a diode module output, and a diode module control terminal. The diode module input is coupled to a first voltage supply terminal. A first driver has a first driver input, a first driver output, a first driver positive supply terminal, and a first driver negative supply terminal. The first driver positive supply terminal is coupled to a second voltage supply terminal, and the first driver negative supply terminal is coupled to a third voltage supply terminal.

An overvoltage detection circuit has first and second overvoltage inputs and an overvoltage output. The first overvoltage input is coupled to the second voltage supply terminal, and the second overvoltage input is coupled to the third voltage supply terminal. The overvoltage output is coupled to the first driver input, and the overvoltage detection circuit is configured to provide a first signal at the overvoltage output. A transistor has first and second current terminals and a first control terminal. The first current terminal is coupled to the first driver output, and the first control terminal is coupled to the first voltage supply terminal.

A second driver has a second driver input, a second driver output, a second driver positive supply terminal, and a second driver negative supply terminal. The second driver input is coupled to the second current terminal. The second driver positive supply terminal is coupled to the first voltage supply terminal, and the second driver negative supply terminal is coupled to a ground terminal. The second driver output is coupled to the diode module control terminal, and the second driver is configured to provide a second signal at the second driver output. A resistor is coupled between the first voltage supply terminal and the second driver input.

DETAILED DESCRIPTION

In this description, the same reference numbers depict same or similar (by function and/or structure) features. The drawings are not necessarily drawn to scale.

A voltage level shifter, also referred to as a voltage level translator, is a circuit that translates a particular signal from one voltage domain to another voltage domain in applications that utilize multiple voltage domains. Bidirectional signal transfer between a high voltage domain and a low voltage domain is a requirement in many power supply and voltage regulator modules (VRMs). Examples of signals being transferred between voltage domains include voltage regulation signals and fault warning signals such as an overvoltage indicator, overcurrent indicator, or overtemperature indicator.

The controller is powered by the low voltage voltage supply, so half-bridge power drive stages typically require a down level shifter to transfer logic signals from the higher voltage power drive stage to the lower voltage controller. Without the down level shifter, the signals from the higher voltage domain could damage or destroy the controller. A traditional monolithic down level shifter may use a drain extended p-channel metal oxide semiconductor (DEPMOS) transistor.

DEPMOS has a source, a gate, a drain, and a drift region between the gate and the drain. The additional layer, the drift region, adds a drift resistance. There is a field plate in DEPMOS that increases the source to drain voltage rating. However, DEPMOS processes typically do not support higher voltages (e.g. >120V). So, bidirectional level shifters for higher voltage signals may require a multi-die multichip module (MCM) solution, thus increasing the cost of the signal level shifter significantly.

Figure 1:
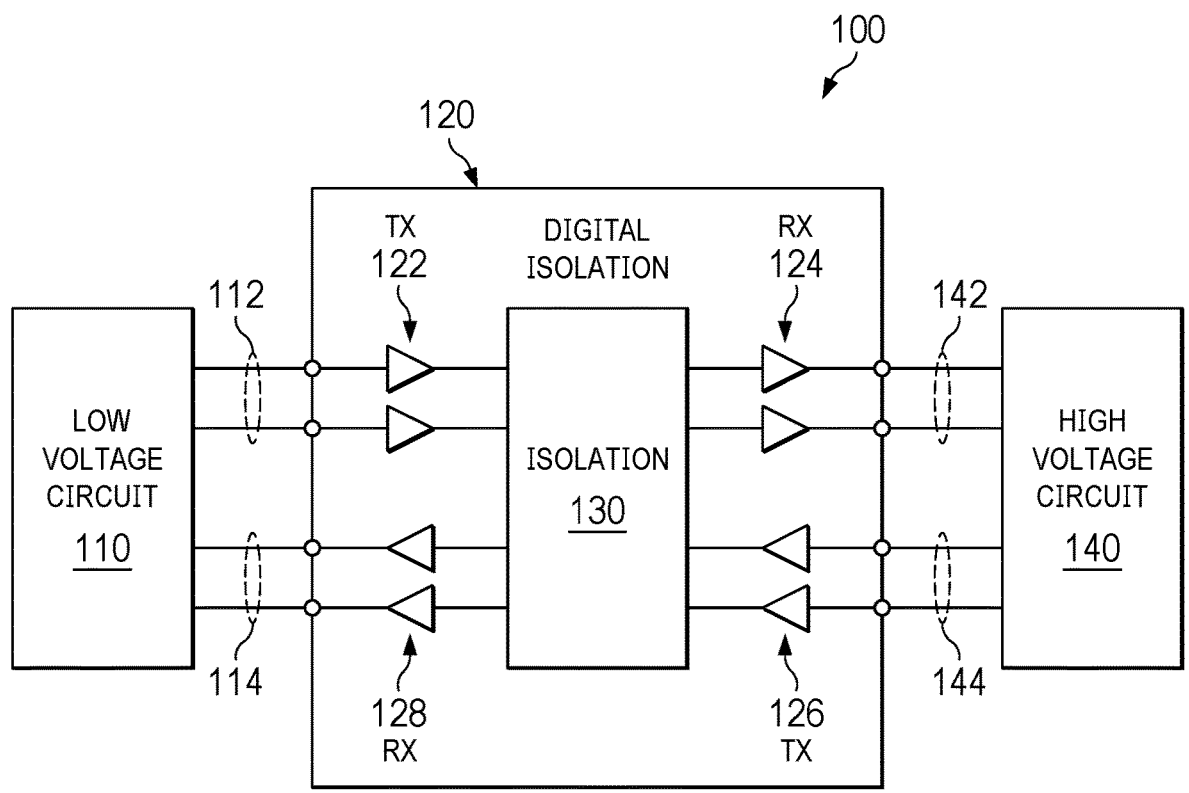
FIG. 1 shows a block diagram for an example signal level shifter providing bidirectional signal transfer between a lower voltage domain and a higher voltage domain.

FIG. 1 shows a block diagram for an example signal level shifter 100 providing bidirectional signal transfer between a lower voltage domain and a higher voltage domain. Signal level shifter 100 includes low voltage circuit 110, isolation circuit 120, and high voltage circuit 140. Low voltage circuit 110 typically operates in a range of 3V-5V, and may include a controller. Low voltage circuit has outputs 112 and inputs 114 for transmitting and receiving, respectively, lower voltage signals. High voltage circuit 140 typically operates in a range 120V-220V, and may include power drivers and field effect transistors (FETs). High voltage circuit 140 has outputs 142 and inputs 144 for receiving and transmitting, respectively, higher voltage signals.

Isolation circuit 120 includes low voltage transmit drivers 122, high voltage receive drivers 124, high voltage transmit drivers 126, low voltage receive drivers 128, and isolator 130. Low voltage transmit drivers 122 receive lower voltage signals 112 from low voltage circuit 110 and provide the signals to isolator 130. Isolator 130 translates the signals from the lower voltage to a higher voltage, and provide the translated signals to the input of high voltage receive drivers 124. The output of high voltage receive drivers 124 provides higher voltage signals 142 to high voltage circuit 140.

High voltage transmit drivers 126 receive higher voltage signals 144 from high voltage circuit 140 and provide the signals to isolator 130. Isolator 130 translates the signals from the higher voltage to a lower voltage, and provide the translated signals to the input of low voltage receive drivers 128. The output of low voltage receive drivers 128 provides lower voltage signals 114 to low voltage circuit 110.

In at least one case, isolation circuit 120 provides a capacitive isolation between the low voltage circuit 110 and the high voltage circuit 140, which performs essentially the same function as a level shifter. The drawback to signal level shifter 100 is that it is a three-die solution. The low voltage circuit 110 is on a first die, isolation circuit 120 is on a second die, and high voltage circuit 140 is on a third die. The three-die solution of signal level shifter requires an MCM, which has a significantly higher cost compared to a monolithic circuit.

Figure 2:
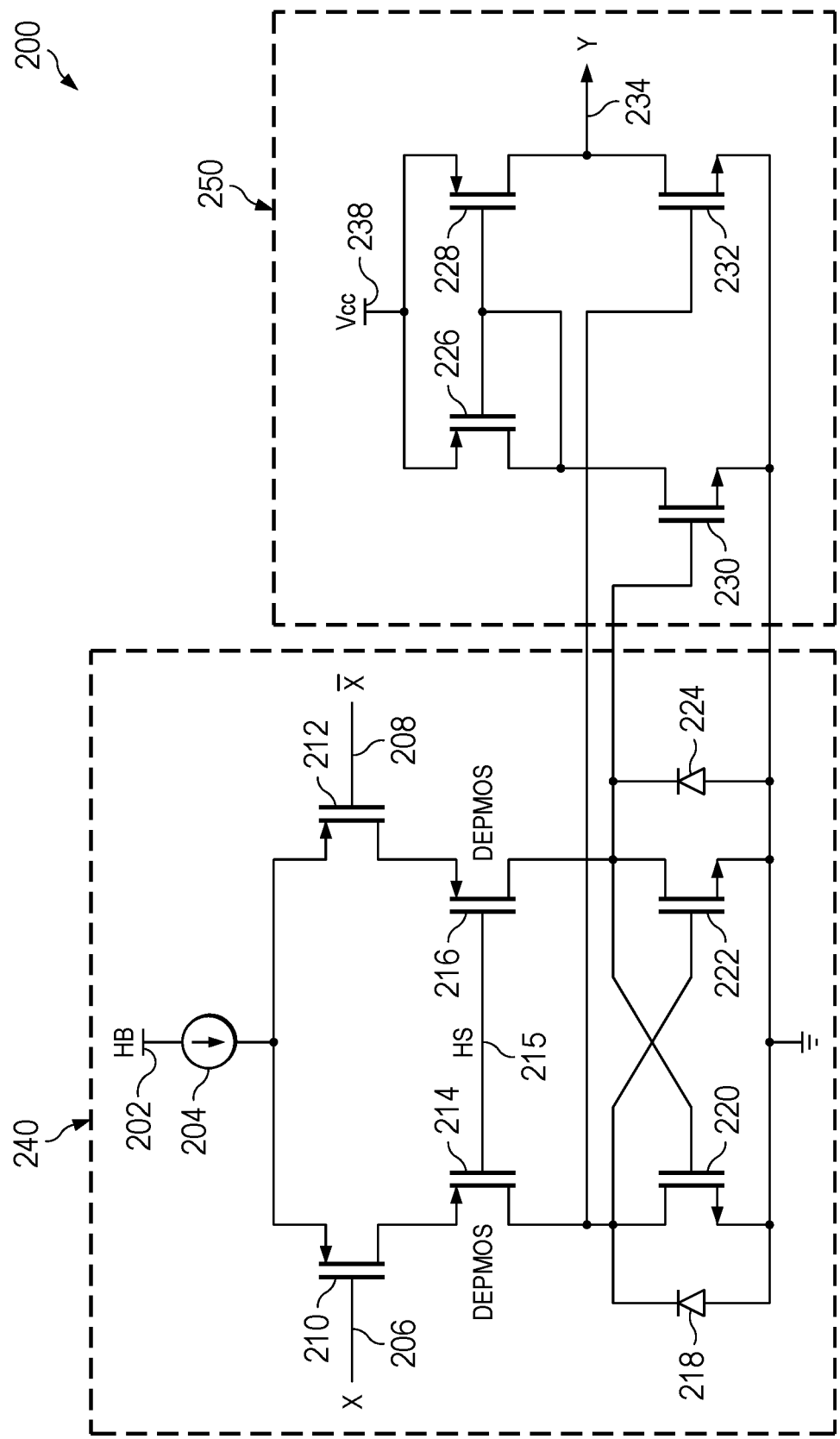
FIG. 2 shows a schematic diagram for an example monolithic signal level shifter.

FIG. 2 shows a schematic diagram for an example monolithic signal level shifter 200. Monolithic signal level shifter 200 includes a lower voltage circuit 250 and a higher voltage circuit 240. The higher voltage circuit is powered by voltage source HB 202, and includes current source 204, transistors 210, 212, 214, 216, 220 and 222, and diodes 218 and 224. The lower voltage circuit is powered by $V_{CC}$ 238 and includes transistors 226, 228, 230 and 232. The higher voltage differential signal is X 206 and X 208, and the translated lower voltage signal is Y 234.

Monolithic signal level shifter 200 has two power domains: HB-HS for the higher voltage circuit, and $V_{CC}$-ground for the lower voltage circuit. Signals must be transmitted and received in both directions to allow the power stage to communicate with a controller. In many cases, the control signal for the power drivers in a drive stage comes from a controller in the lower voltage domain. Therefore, the control signal is provided to the signal level shifter, which transfers the signal from the $V_{CC}$-ground domain to the HB-HS domain. Similarly, controller monitoring may occur on the higher voltage side, such as undervoltage lockout (UVLO) and overvoltage lockout (OVLO) which detects whether the difference between HB and HS is exceeding 5V. Signals such as UVLO and OVLO are provided to the signal level shifter, which transfers the signal from the HB-HS domain to the $V_{CC}$-ground domain. Another example of a signal that may need level translation is a zero voltage detection (ZVD) signal which is detected in the higher voltage domain and then translated to the lower voltage domain before being provided to a controller.

The signals being transferred in monolithic signal level shifter 200 are X 206 and X 208 in the higher voltage circuit 240, and Y 234 in the lower voltage circuit 250. This signal X 206 is provided to the gate of transistor 210, and the signal X 208 is provided to the gate of transistor 212. Transistors 210 and 212 are supplied by HB 202 through current source 204. The gate of transistor 214 and the gate of transistor 216 are coupled together, and coupled to HS 215. In some cases, HS 215 is connected to the switching terminal of a switching voltage regulator. Cross-coupled transistors 220 and 222 are coupled to the drains of transistors 214 and 216. The sources of transistor 220 and 222 are each coupled to ground. Diode 218 is coupled between the source and the drain of transistor 220. Diode 224 is coupled across transistor 222 from source to drain. Transistors 214 and 216 block current and protect against high voltages between HB 202 and ground, which in some cases could be 200V.

Transistors 226 and 228 are configured to form a current mirror. The sources of transistors 226 and 228 are coupled to and supplied by $V_{CC}$ 238. Transistor 230 is coupled between the drain of transistor 226 and ground, and has a gate coupled to the drain of transistor 222. Transistor 232 is coupled between the drain of transistor 228 and ground, and has a gate coupled to the drain of transistor 220. The signal Y 234 is provided at the drains of transistors 228 and 232, which are coupled together.

Figure 3:
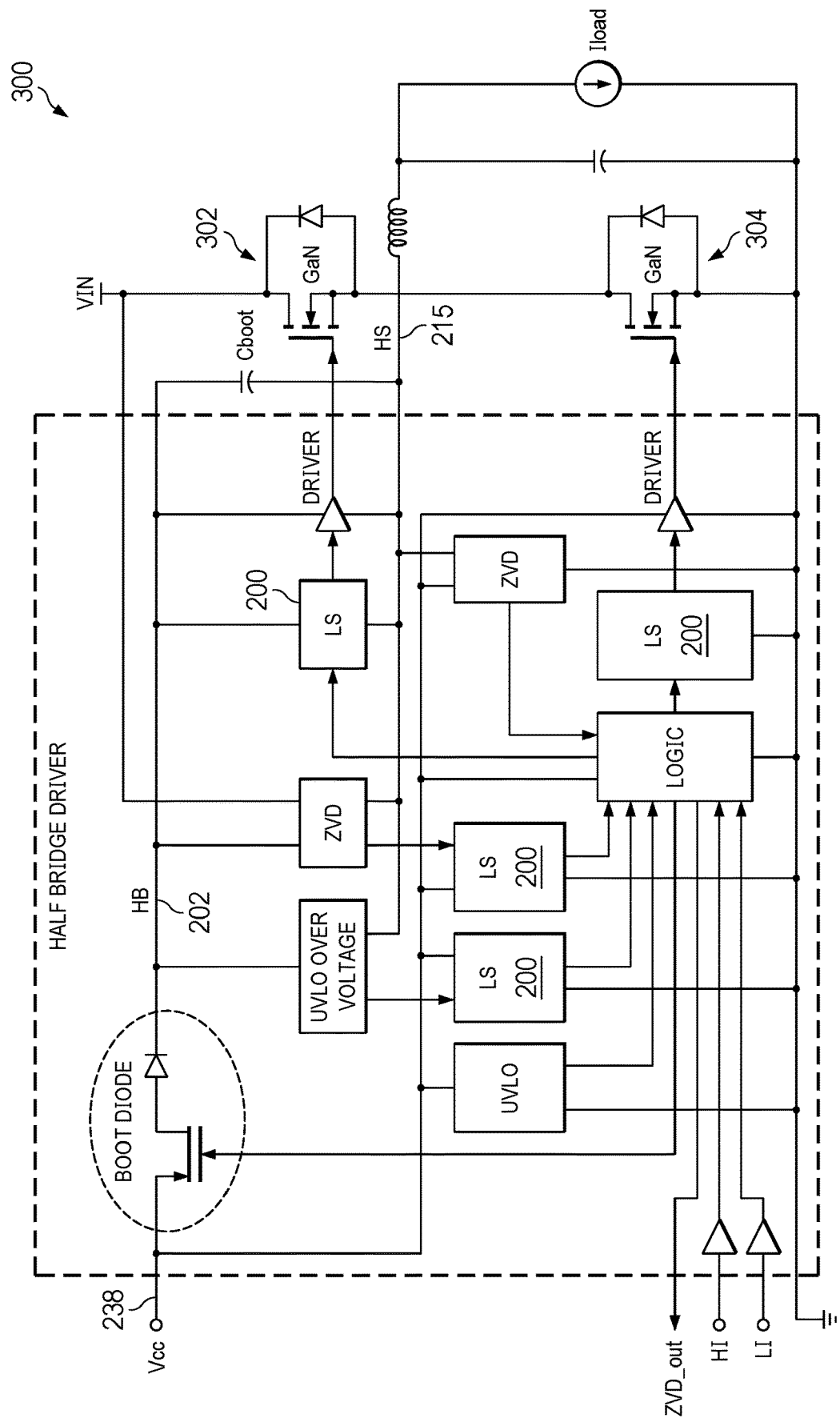
FIG. 3 shows a block diagram for an example monolithic power drive stage with a bidirectional level shifter operating across two voltage domains.

FIG. 3 shows a block diagram for an example monolithic power drive stage 300 with a bidirectional monolithic signal level shifter 200 operating across two voltage domains. A controller (not shown) operates in a lower voltage domain defined by $V_{CC}$ 238 and ground. HB 202 and HS 215 define a higher voltage domain, which in at least some cases is a floating supply domain. A boot capacitor (typically external) between HB 202 and HS 215 acts as a floating power supply. The voltage difference between HB 202 and HS 215 may be regulated to 5V for efficient and reliable operation of the high-side GaN FET 302.

Boot capacitor $C_{boot}$ is charged from $V_{CC}$ 238 when low-side GaN FET 304 is turned on. It is possible to overcharge boot capacitor $C_{boot}$ during third quadrant conduction of the switching converter. For this reason, a regulation feedback loop is added to the circuit to prevent the overcharging of boot capacitor $C_{boot}$. This feedback requires a level shifter to translate the signal from the higher voltage domain to the lower voltage domain. The zero voltage detection signal (ZVD) is transferred to the controller (not shown) to optimize the dead time during third quadrant conduction over multiple cycles to improve efficiency. The ZVD signal must also be translated from the higher voltage domain to the lower voltage domain.

Based on whether the high-side GaN FET 302 or low-side GaN FET 304 is turned on, the voltage at HS 215 will be moving between $V_{IN}$ and ground. But, the gate-to-source voltage of both the high-side GaN FET 302 and low-side GaN FET 304 should not exceed 5V to avoid overstressing the devices. The voltage between $V_{CC}$ and ground is 5V, and the voltage between HB 202 and HS 215 is 5V. The voltage difference between HB 202 and HS 215 is set to 5V by the boot diode, which in at least one case is a transistor and a diode. Capacitor $C_{boot}$ is charged from $V_{CC}$ 238 when the low-side GaN FET 304 is turned on.

To transfer a signal from the lower voltage circuit to the higher voltage circuit, a 200V transistor fabricated in an NMOS, LDMOS or drain-extended NMOS (DENMOS) process has traditionally been required. The gate-to-source voltage ($V_{GS}$) of the transistor is typically 5V. But, when the transistor is turned off, it must be able to withstand 200V between its drain and its source without being damaged. This is within the capabilities of a DENMOS or LDMOS component, so this component can be used for a lower voltage circuit to the higher voltage circuit signal level shifter.

However, a complementary DEPMOS device is needed to implement a higher voltage circuit to lower voltage circuit signal level shifter. The $V_{GS}$ is also at 5V in the DEPMOS device. So, if the source is at 200V, the voltage at the drain can come down to 0V, but the voltage at the gate can only go to 195V, because the transistor will be destroyed if the $V_{GS}$ exceeds 5V. However, traditional 200V DEPMOS processes do not provide adequate transistor performance characteristics for a level shifter application. So, there is a need for a level shifter that can transfer a signal from the higher voltage (HB-HS) domain to the lower voltage ($V_{CC}$-ground) domain without the use of a DEPMOS transistor.

Figure 4:
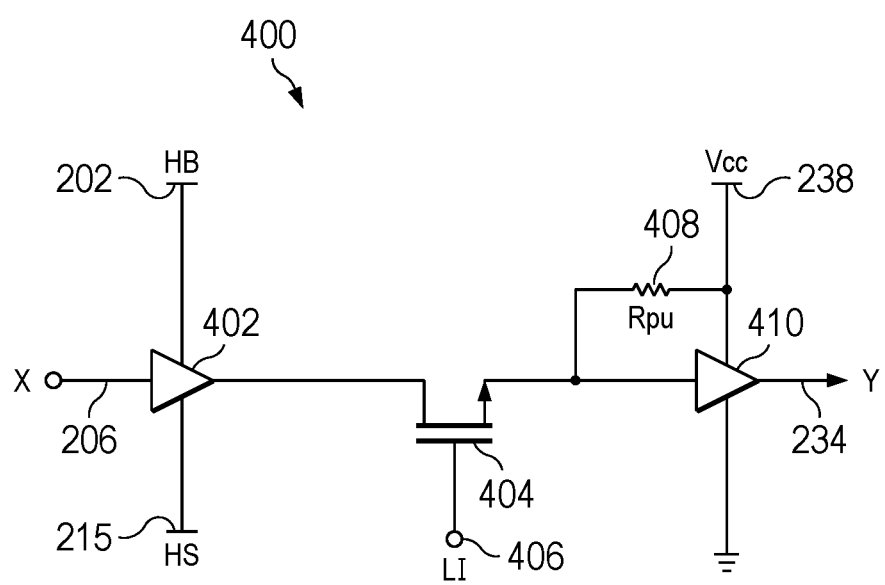
FIG. 4 shows a simplified schematic diagram for an example monolithic level shifter.

FIG. 4 shows a simplified schematic diagram for an example monolithic level shifter 400. X 206 is a higher voltage domain signal to be translated to a lower voltage domain. In this case, X 206 is a single-ended signal, but X could be a differential signal in other cases. Higher Signal X, which is from the higher voltage domain, is provided to the input of driver 402. Driver 402 is powered by HB 202 on the positive rail, and HS 215 on the negative rail. The output of driver 402 is coupled to the drain of transistor 404.

Transistor 404 provides isolation between the higher voltage domain and the lower voltage domain. The source of transistor 404 is coupled to the input of driver 410. A gate drive signal L1 is provided to the gate of transistor 404. Driver 410 is powered by $V_{CC}$ 238 on the positive rail, and the negative rail of driver 410 is coupled to ground. In at least one case, the voltage at HB 202 is more than ten times the voltage at $V_{CC}$ 238.

The output of driver 410 provides the signal Y 234, which is the signal X translated from the higher voltage domain to the lower voltage domain. Resistor 408 is coupled between $V_{CC}$ 238 and the source of transistor 404. Resistor 408 helps to ensure that the voltage at the input to driver 410 is not left floating when transistor 404 is turned off, which could lead to an unpredictable voltage at the output of driver 410.

Unlike transistors 214 and 216 of monolithic signal level shifter 200 which are DEPMOS transistors, transistor 404 is a laterally-diffused metal oxide semiconductor (LDMOS) transistor. In at least one case, transistor 404 is a 200V LDMOS transistor, but the voltage rating of transistor 404 can be chosen to satisfy the maximum voltage specification for a specific application. In contrast to the unsatisfactory performance of a traditional 200V DEPMOS transistor, the performance of a traditional 200V LDMOS transistor is able to meet the performance requirements for a monolithic high-voltage level shifter.

Figure 5:
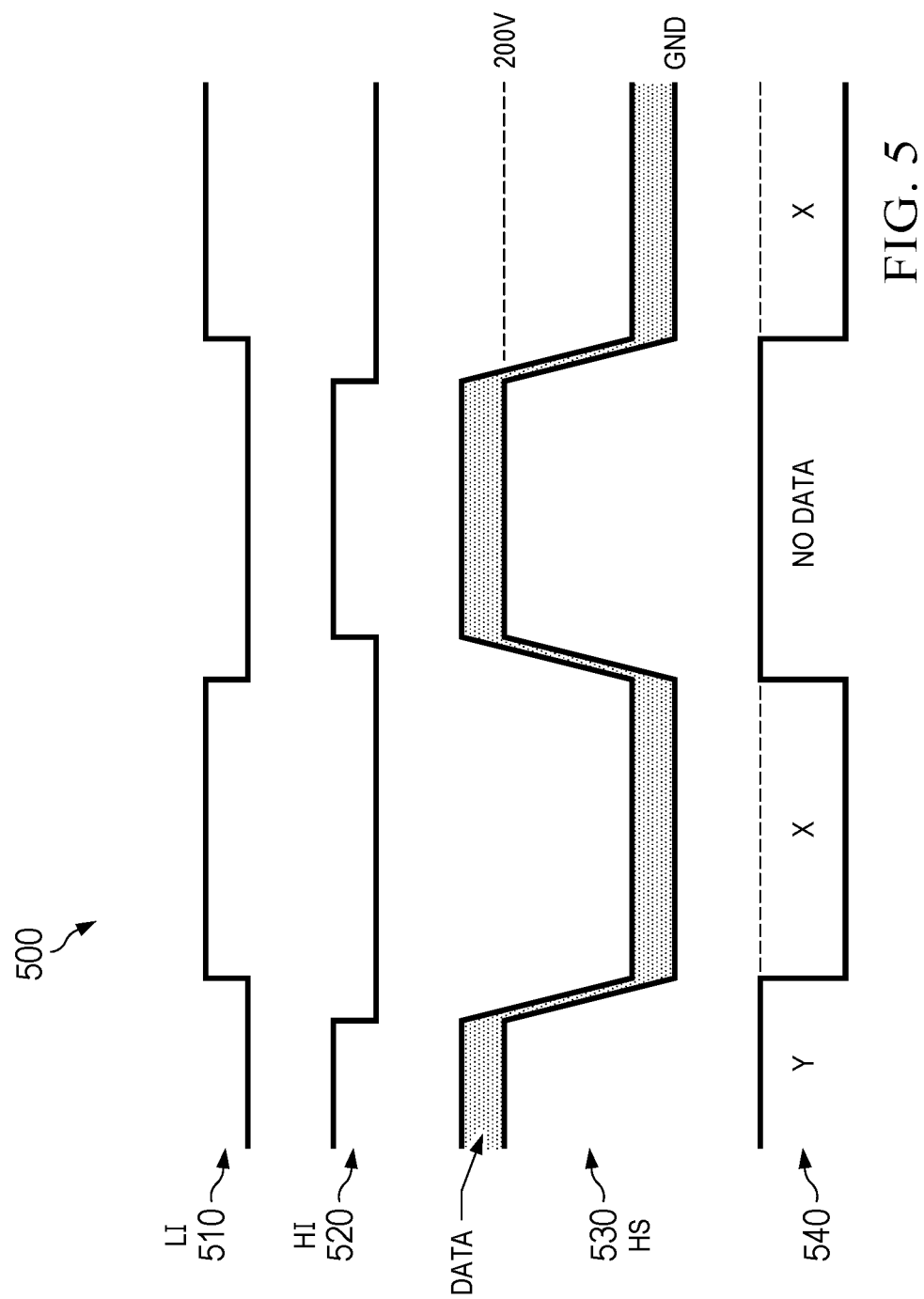
FIG. 5 shows an example timing diagram for a monolithic level shifter.

FIG. 5 shows an example timing diagram 500 for monolithic level shifter 400. Graph 510 shows a timing diagram for the signal L1 406, which is a control signal provided to the gate of transistor 404 and the gate of a low-side drive FET (not shown). Graph 520 shows a timing diagram for a high-side drive FET control signal HI which is generated in the lower voltage domain and translated to the higher voltage domain. Graph 530 shows a timing diagram for the signal HS 215. Graph 540 shows a timing diagram for the signal Y 234.

The HS signal 530 varies between ground and 200V. A data signal is riding superimposed on top of the HS signal 530. The data signal carries the information to be transferred between the higher voltage domain and the lower voltage domain. The HS signal 530 is cyclical with the signal being high during part of the cycle and low during part of the cycle. When the HS signal 530 is low, transistor 404 is turned on, and the data signal that is superimposed on HS 530 can be transferred from the higher voltage domain to the lower voltage domain. However, when the HS signal 530 is high, transistor 404 is turned off, and no current flows through transistor 404.

Transistor 404 acts as a pass gate for the data signal that is superimposed on the HS signal 530 only when the HS signal 530 is in the low voltage part of its cycle. Transistor 404 will block all current when the HS signal 530 is high (e.g. 200V), isolating the higher voltage domain from the lower voltage domain during that time. The signal is transferred from the higher voltage domain to the lower voltage domain when the HS signal 530 is low.

Monolithic level shifter 400 does not act as a continuous time level shifter, but is instead a sampled level shifter. The signal superimposed on HS 530 is sampled during the high cycle of HS 215. The signal is held or temporarily stored, then transferred from the higher voltage domain to the lower voltage domain during the next low cycle of the HS signal 530. An important consideration is that the signal can be blocked by transistor 404, which is a 200V LDMOS transistor, without overstressing or damaging transistor 404. The voltage at HB 202 will always be 5V higher than the voltage at HS 215. So, as the voltage at HS 215 varies between ground and 200V, the voltage at HB 202 will vary from 5V to 205V in phase with the voltage at HS 215.

The signal X 206 can be any signal of interest in the higher voltage domain, and Y 234 is the same signal of interest translated into the lower voltage domain. In many cases, HS 215 is also connected to the switching terminal of a converter power stage. Resistor 408 acts as a pullup resistor for the input of driver 410. Resistor 408 being connected between $V_{CC}$ 238 and the input to driver 410 helps to prevent the voltage at the source terminal of 404 from simply floating when transistor 404 is turned off. The signal will be blocked when transistor 404 is turned off, and the data signal is not available during that time for use during that half of the HS cycle. However, if the input to driver 410 is left floating, a current may flow from $V_{CC}$ 238 to ground. To avoid this condition, the input to driver 410 is initialized to $V_{CC}$ 238. So, when transistor 404 is turned off, the HS signal 530 is high, and the signal is not being passed.

Transistor 404 can be synchronized with the low-side drive FET in the drive stage by providing the signal L1 406 to the gate of each of them. When signal L1 406 is high, the voltage difference between HB 202 and HS 215 is equal to the voltage difference between $V_{CC}$ 238 and ground. The signal is transferred from the higher voltage domain to the lower voltage domain when the low-side drive FET is turned on. The signal is blanked off while the high-side drive FET is turned off. The output of the level shifter, Y 234, is pulled high during the blanking period.

Boot regulation is another application that may require the transfer of a signal from the higher voltage domain to the lower voltage domain. A switch controls the charging of a boot capacitor. An overvoltage detection circuit provides a feedback mechanism for the boot regulation control loop. If the difference in voltage between HB 202 and HS 215 exceeds 5V, the overvoltage detection circuit detects this and provides an output signal as a control signal to stop charging the boot capacitor.

Figure 6:
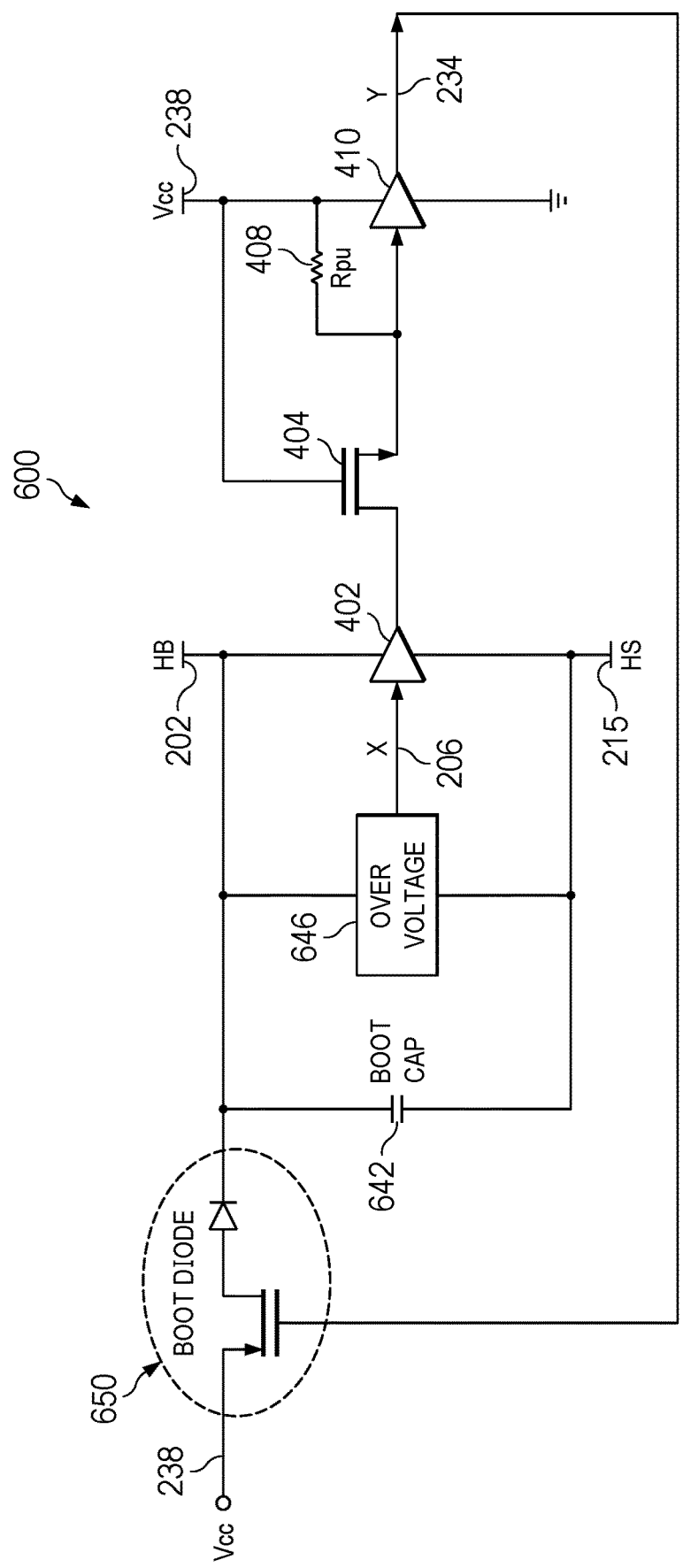
FIG. 6 shows a schematic diagram for an example monolithic signal level shifter in a boot regulation circuit.

FIG. 6 shows a schematic diagram for an example monolithic signal level shifter in a boot regulation circuit. Boot diode 650 is coupled between $V_{CC}$ 238 and HB 202. Boot diode 650 is a switch and a diode in series. The switch of boot diode 650 can be a transistor. Boot capacitor 642 is coupled between HB 202 and HS 215. Boot capacitor 642 may have a capacitance in the range of several microfarads. Boot capacitor 642 may be located on the same monolithic substrate as the other circuitry, or may be located external to the device. Boot capacitor 642 stores charge receives from the switch of boot diode 650. Boot capacitor 642 is charged from $V_{CC}$ 238 during a period when the low-side drive FET (not shown) is turned on.

Overvoltage detection circuit 646 has a first input coupled to HB 202, and a second input coupled to HS 215. Overvoltage detection circuit 646 includes circuitry to compare the voltage of HB 202 and the voltage of HS 215 and provide a signal at its output indicating whether the difference in those voltages is exceeding 5V. The output of overvoltage detection circuit 646 is X 206, which is the signal to be translated from the lower voltage domain to the higher voltage domain.

Driver 402 is powered by HB 202 on the positive rail, and HS 215 on the negative rail. The input of driver 402 is coupled to the output of overvoltage detection circuit 646 and receives the signal X 206. The output of driver 402 is coupled to the drain of transistor 404, which in at least one case is a p-channel LDMOS FET. The gate of transistor 404 is coupled to $V_{CC}$ 238, so the voltage at the gate of transistor 404 remains at a constant value. The turning on and turning off of transistor 404 is controlled by the output of driver 402, which is controlled by the voltage swing of HS 215.

Transistor 404 provides isolation between the higher voltage domain and the lower voltage domain. The source of transistor 404 is coupled to the input of driver 410. Driver 410 is powered by $V_{CC}$ 238 on the positive rail, and the negative rail of driver 410 is coupled to ground. The output of driver 410 provides the signal Y 234, which is the overvoltage output signal X translated from the higher voltage domain to the lower voltage domain. Resistor 408 is coupled between $V_{CC}$ 238 and the source of transistor 404.

If the overvoltage output signal X is high (or true), the signal is transferred to the lower voltage ($V_{CC}$) domain, then goes back to boot diode 650 and turns boot diode 650 off to stop charging the boot capacitor 642. Charging of boot capacitor 642 only occurs when the voltage at HS 215 is at ground or below ground. If the voltage at HS 215 is higher than $V_{CC}$, then boot diode 650 blocks the charging of boot capacitor 642. The current can flow through boot diode 650 only when the voltage at HS 215 is at or below ground.

Figure 7:
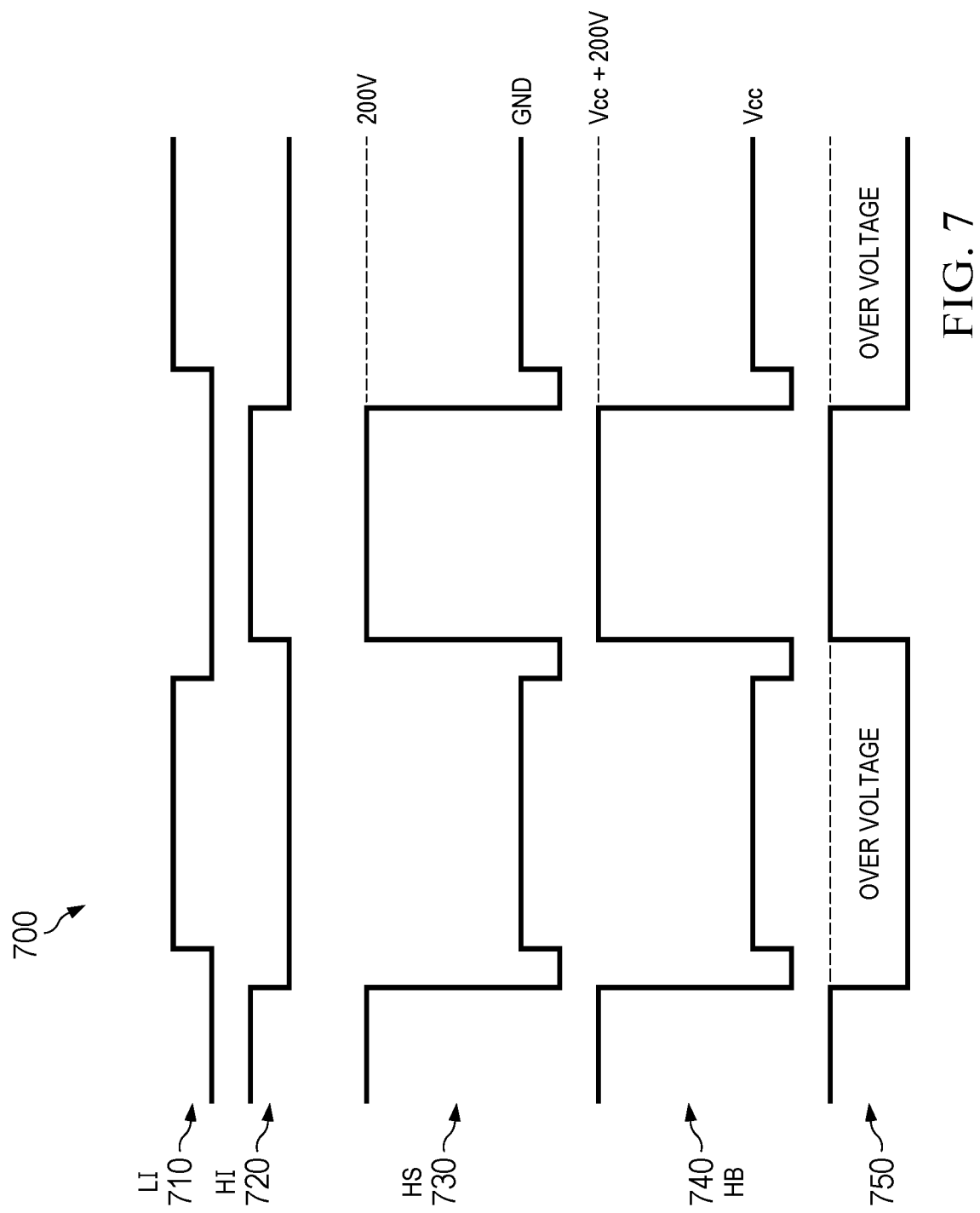
FIG. 7 shows an example timing diagram for a monolithic signal level shifter in a boot regulation circuit.

FIG. 7 shows a timing diagram 700 for the example monolithic signal level shifter in a boot regulation circuit 600. Graph 710 shows a timing diagram for the signal L1, which is a signal that controls a low-side drive FET (not shown). Graph 720 shows a timing diagram for the signal HI, which is a signal that controls a high-side drive FET (not shown). HI is generated in the lower voltage domain, then translated to the higher voltage domain to be provided to the gate of the high-side drive FET. Graph 730 shows a timing diagram for the signal HS 215. Graph 740 shows a timing diagram for the signal HB 202. Graph 750 shows a timing diagram for the signal X, which is the output of overvoltage detection circuit 646.

When L1 710 is high, the low-side FET (not shown) turns on, causing HS 730 to be pulled down to ground. As HS 730 is pulled down to ground, HB 740 goes below 5V if the difference between the voltage at HB 202 and HS 215 is less than 5V. In response to this, the boot diode 650 is turned on, allowing current to flow from $V_{CC}$ 238 to boot capacitor 642, storing charge in the boot capacitor 642. The voltage at HB 740 will increase and go up to 4.2-4.3V, which in some cases is 0.7-0.8V below $V_{CC}$ 238.

The voltage difference between HB 740 and HS 730 will build up even above 5V, then the overvoltage detection circuit 646 will detect this and stop charging the boot capacitor 642 by tuning off the boot diode 650. So, there is a closed loop regulation that ensures that the voltage difference between HB 740 and HS 730 does not exceed 5V, and will help to increase the voltage difference if the difference is less than 5V. This occurs while the low-side drive transistor is turned on. As soon as the low-side drive transistor turns off and the high-side drive transistor turns on, HS 730 will go to 200V, and HB 740 will go to 105V. In this case, boot diode 650 blocks current because it is reverse biased, and no current flows through a reverse biased diode.

In this description, "terminal," "node," "interconnection," "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground and/or any other form of ground connection applicable to, or suitable for, the teachings of this description.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, so device B is controlled by device A via the control signal generated by device A.

In this description, even if operations are described in a particular order, some operations may be optional, and the operations are not necessarily required to be performed in that particular order to achieve specified results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A circuit for voltage level shifting, comprising:
a first driver having a first driver input, a first driver output, a first driver positive supply terminal, and a first driver negative supply terminal, wherein the first driver input is configured to receive a first signal, the first driver positive supply terminal is coupled to a first voltage supply terminal, and the first driver negative supply terminal is coupled to a second voltage supply terminal;
a transistor having first and second current terminals and a first control terminal, wherein the first current terminal is coupled to the first driver output, and the first control terminal is adapted to be coupled to a low-side drive transistor control terminal;
a second driver having a second driver input, a second driver output, a second driver positive supply terminal, and a second driver negative supply terminal, wherein the second driver input is coupled to the second current terminal, the second driver positive supply terminal is coupled to a third voltage supply terminal, the second driver negative supply terminal is coupled to a ground terminal, the second driver is configured to provide a second signal at the second driver output, and a voltage at the third voltage supply terminal is less than 10% of a voltage at the first voltage supply terminal; and
a resistor coupled between the third voltage supply terminal and the second driver input.

2. The circuit of claim 1, wherein the transistor is a laterally-diffused metal oxide semiconductor (DEPMOS) transistor.

3. The circuit of claim 2, wherein the second voltage supply terminal is coupled to a switching terminal of a switching voltage regulator.

4. The circuit of claim 1, wherein the first signal is in a first voltage domain, and the second signal is in a second voltage domain.

5. The circuit of claim 4, wherein the first voltage domain is a higher voltage domain, and the second voltage domain is a lower voltage domain.

6. The circuit of claim 1, wherein the first signal is superimposed on a voltage at the second voltage supply terminal.

7. The circuit of claim 6, wherein the voltage at the second voltage supply terminal is cyclically varying between a high level and a low level.

8. The circuit of claim 7, wherein the second signal is valid only while the voltage at the second voltage supply terminal is at the low level.

9. The circuit of claim 1, wherein the first signal is providing information about one of: an overvoltage condition, an overcurrent condition, and an overtemperature condition.

10. The circuit of claim 1, wherein the second signal is provided to a controller.

11. A level shifting circuit, comprising:
a diode module having a diode module input, a diode module output, and a diode module control terminal, wherein the diode module input is coupled to a first voltage supply terminal
a first driver having a first driver input, a first driver output, a first driver positive supply terminal, and a first driver negative supply terminal, wherein the first driver positive supply terminal is coupled to a second voltage supply terminal, and the first driver negative supply terminal is coupled to a third voltage supply terminal;
an overvoltage detection circuit having first and second overvoltage inputs and an overvoltage output, wherein the first overvoltage input is coupled to the second voltage supply terminal, the second overvoltage input is coupled to the third voltage supply terminal, the overvoltage output is coupled to the first driver input, and the overvoltage detection circuit is configured to provide a first signal at the overvoltage output;
a transistor having first and second current terminals and a first control terminal, wherein the first current terminal is coupled to the first driver output, and the first control terminal is coupled to the first voltage supply terminal;
a second driver having a second driver input, a second driver output, a second driver positive supply terminal, and a second driver negative supply terminal, wherein the second driver input is coupled to the second current terminal, the second driver positive supply terminal is coupled to the first voltage supply terminal, the second driver negative supply terminal is coupled to a ground terminal, the second driver output is coupled to the diode module control terminal, and the second driver is configured to provide a second signal at the second driver output; and
a resistor coupled between the first voltage supply terminal and the second driver input.

12. The level shifting circuit of claim 11, further comprising a capacitor coupled between the second voltage supply terminal and the third voltage supply terminal.

13. The level shifting circuit of claim 11, wherein a voltage at the first voltage supply terminal is less than 10% of a voltage at the second voltage supply terminal.

14. The level shifting circuit of claim 11, wherein the diode module includes a switch in series with a diode.

15. The level shifting circuit of claim 11, wherein the transistor is a laterally-diffused metal oxide semiconductor (DEPMOS) transistor.

16. The level shifting circuit of claim 11, wherein the third voltage supply terminal is coupled to a switching terminal of a switching voltage regulator.

17. The level shifting circuit of claim 11, wherein the first signal is in a first voltage domain, and the second signal is in a second voltage domain.

18. The level shifting circuit of claim 17, wherein the first voltage domain is a higher voltage domain, and the second voltage domain is a lower voltage domain.

19. The level shifting circuit of claim 11, wherein the first signal is superimposed on a voltage at the third voltage supply terminal.

20. The level shifting circuit of claim 19, wherein the voltage at the third voltage supply terminal is cyclically varying between a high level and a low level.

21. The level shifting circuit of claim 20, wherein the second signal is valid only while the voltage at the third voltage supply terminal is at the low level.

* * * * *